United States Patent
Schneider et al.

(10) Patent No.: US 8,177,948 B2
(45) Date of Patent: May 15, 2012

(54) DEVICE FOR CARBON DEPOSITION

(75) Inventors: Günter Schneider, Besigheim (DE); Alexander Schattke, Buzsa Bademli (TR); Rainer Feuerfeil, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 1014 days.

(21) Appl. No.: 11/629,972

(22) PCT Filed: Apr. 26, 2005

(86) PCT No.: PCT/EP2005/051849
§ 371 (c)(1),
(2), (4) Date: Jun. 5, 2008

(87) PCT Pub. No.: WO2005/124818
PCT Pub. Date: Dec. 29, 2005

(65) Prior Publication Data
US 2008/0271998 A1    Nov. 6, 2008

(30) Foreign Application Priority Data
Jun. 18, 2004    (DE) .......................... 10 2004 029 526

(51) Int. Cl.
*C23C 14/00* (2006.01)
(52) U.S. Cl. ............... 204/298.41; 204/192.38
(58) Field of Classification Search ............. 204/192.38, 204/298.41
See application file for complete search history.

(56) References Cited

U.S. PATENT DOCUMENTS

| | | | |
|---|---|---|---|
| 5,096,558 A * | 3/1992 | Ehrich ...................... | 204/192.38 |
| 5,302,271 A * | 4/1994 | Chan et al. ............... | 204/298.41 |
| 6,355,350 B1 | 3/2002 | Guseva et al. | |
| 2003/0035905 A1 | 2/2003 | Lieberman et al. | |

FOREIGN PATENT DOCUMENTS

| | | |
|---|---|---|
| DE | 101 55 120 | 5/2003 |
| DE | 10155120 A1 * | 5/2003 |
| RU | 2 153 782 | 7/2000 |
| RU | 2153782 C1 * | 7/2000 |

OTHER PUBLICATIONS

Translation of DE 101 55 120 published May 5, 2003 to Dr. Ernst Klinkenberg.*
Translation to Goncharenko (RU 2153782) published Jul. 2000, cited on IDS dated Mar. 21, 2011.*
International Search Report (including translation) for PCT/EP2005/051849, Sep. 2005.

* cited by examiner

*Primary Examiner* — Keith Hendricks
*Assistant Examiner* — John Brayton
(74) *Attorney, Agent, or Firm* — Kenyon & Kenyon LLP

(57) ABSTRACT

A method for carbon deposition using a pulsed, plasma-supported vacuum arc discharge, having an anode, a target cathode made of carbon, a pulsed energy source and at least two ignition units. The at least two ignition units are positioned in the edge area of target cathode and each have two planar metallic electrodes and a planar ceramic insulator positioned between the electrodes. The planar shape of ignition units and their positioning on target cathode enables homogeneous utilization of the entire target surface and homogeneous coating of workpieces.

6 Claims, 3 Drawing Sheets

DEVICE FOR CARBON DEPOSITION

BACKGROUND INFORMATION

A number of physical deposition methods are known for coating workpieces, in particular tribologically heavily stressed components that are simultaneously subject to an additional stress of a different type, such as temperature or cavitation. Two different methods from the field of plasma coating technology for producing carbon coatings that are free of metal and hydrogen (so-called tetrahedrally coordinated amorphous carbon, ta-C) can be named: deposition of graphite targets by sputtering or by arc vaporization.

The sputtering method is characterized by a low deposition rate, however, so that this method is poorly suited for economical use.

In arc vaporization the cathode is typically made of the material to be vaporized, while a special electrode is available as the anode, or the wall of the coating chamber can function as the anode. To vaporize the target material, an arc is ignited between the anode and the cathode which heats the cathode locally so intensely at the arc spot, recognizable by a burning point on the cathode, that the target material changes to the vapor phase and precipitates on a workpiece. An ignition device is needed to produce the arc between the anode and the cathode.

In addition to movable ignition devices, fixed ignition electrodes located near the target cathode are known, between which an arc is ignited which then moves from the ignition electrode to the anode.

Controlled direct current (dc) arc vaporization of carbon turns out to be difficult, since the burning point of the arc tends to become stuck at one place on the target and possibly to burn through. It is also known that in the vaporization process droplets (macro-particles) result in increased roughness of the coating on the workpiece. This method is therefore also only employed to a limited extent.

With pulsed arc discharge, on the other hand, pulsing current is applied between the anode and the cathode, causing the arc spot on the target to move approximately 100 times as fast as in dc arc vaporization, thereby preventing the localized burning. The pulsed arc discharge generally has a pulse length in the range of milliseconds (msec), which causes the discharge to be localized in spatial proximity to the ignition.

If one wishes to utilize the technology of pulsed arc discharge with large-area targets, an arrangement using a plurality of individual ignition sources therefore makes sense.

From Russian Patent No. RU 2153782 a carbon plasma pulse source for applying a carbon coating to a workpiece is known, which includes among other components a graphite cathode, an anode, a capacitive accumulator circuit and at least two ignition units positioned on the circumference of the graphite cathode. With this system the area coated with the layer of carbon is enlarged compared to a device having only one ignition unit, and at the same time the thickness of the layer applied to the workpiece is more uniform. The ignition units include a rod-shaped metallic electrode and a ring-shaped graphite electrode which function as the ignition cathode and the ignition anode, respectively. Positioned between the ignition cathode and the ignition anode is a ring made of a dielectric material, the dielectric material being coated on the side facing the target cathode with an electrically conductive material. The longitudinal axis of each ignition unit is directed towards the corresponding region of the working area of the target cathode which is provided for starting the arc discharge.

The ring-shaped structure of the ignition cathode and of the dielectric material may have a detrimental effect on economic and maximally homogeneous utilization of the target surface: The quasi-punctiform action of the ignition source causes the locus of ignition on the target surface to be confined to a relatively small zone, so that a certain place is eroded from repeated discharges, while the adjacent areas on the target surface remain largely unaffected. In time, such pronounced erosion zones result in undesired cratering on the target cathode.

In order to be able nevertheless to erode the entire target surface as homogeneously as possible, the ignition sources must be located as close together as possible. This results in an increase in the number of ignition sources needed per unit of length of the target cathode, and consequently in an increase in the maintenance expense and in instability when the coating system is used continuously.

It must also be kept in mind that the ignition units are subject to severe heat, and should be cooled for stable long-term operation and/or high ignition frequencies. The cooling of round-shaped ignition units is quite complex technologically, since for each individual ignition unit the cooling device must be adapted to the ring-shaped structure of the electrodes, and therefore should have corresponding roundings.

Overall, the described problems make it difficult to make simple and stable use of the coating method using pulsed vacuum arc discharge economically with large-surface targets.

SUMMARY OF THE INVENTION

The device according to the present invention for carbon deposition has the advantage that the disadvantages named above are eliminated, and that homogeneous distribution of the locus of ignition of the arc on a target surface of any size desired is thereby achieved.

At the same time, the system using the device can be operated in a simple manner so stably and reliably that industrial utilization is possible.

DETAILED DESCRIPTION

Figure 1:
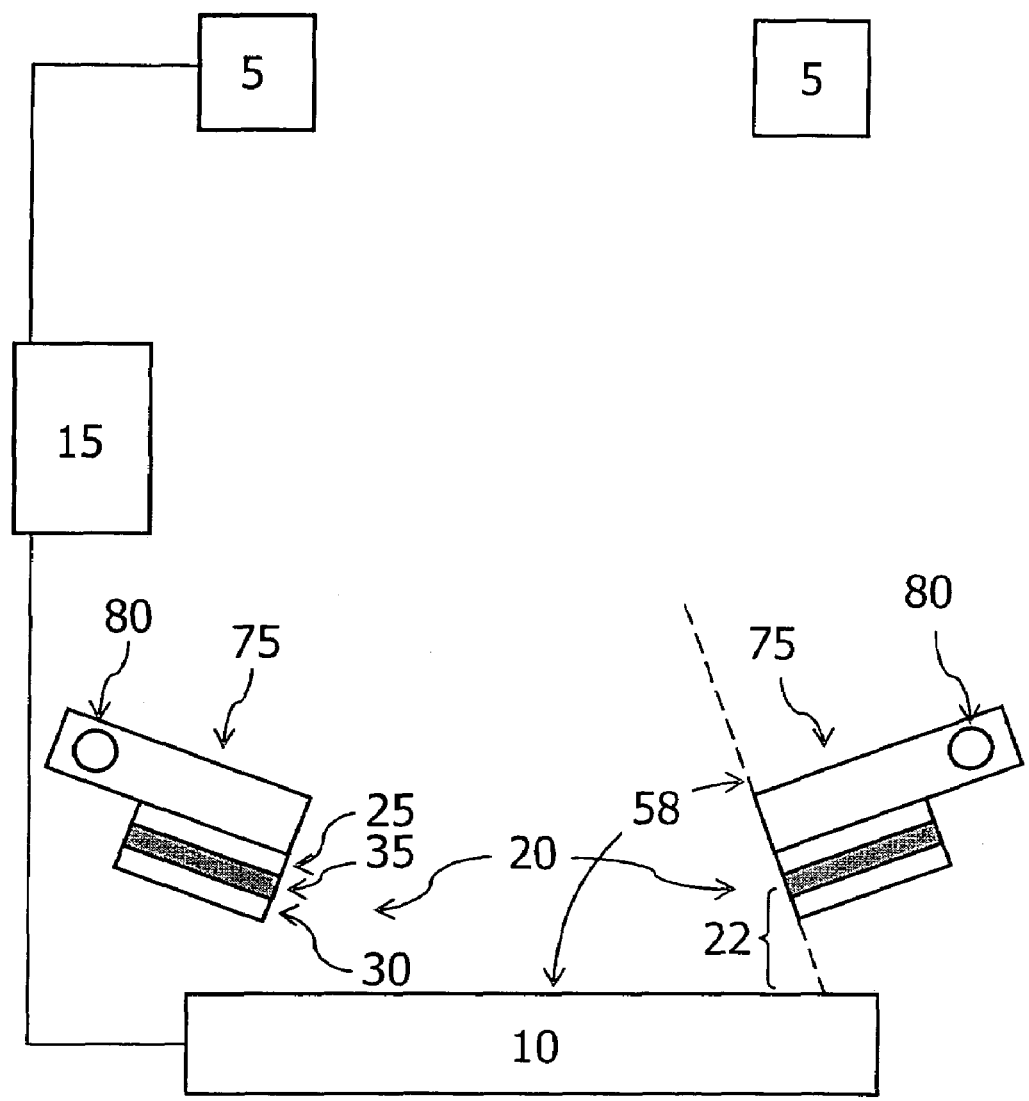
FIG. 1 shows a device for carbon deposition with its important components.

The device depicted in FIG. 1 for carbon deposition is made up primarily of an anode 5, a planar target cathode 10, a pulsed energy source 15, and at least two ignition units 20. Ignition units 20 are positioned in the edge area of target cathode 10 (also see FIG. 4).

Connected between target cathode 10, made of carbon, and anode 5, is pulsed energy source 15, which is typically designed as a capacitor. The capacitor is fed via an ac power supply, not shown, and remains charged initially, since there is a vacuum between anode 5 and target cathode 10 and hence the electric circuit is not closed. To ignite an arc between anode 5 and target cathode 10, and thus to give off carbon from target cathode 10 in the direction of anode 5, the at least two ignition units 20 are provided.

Figure 2:
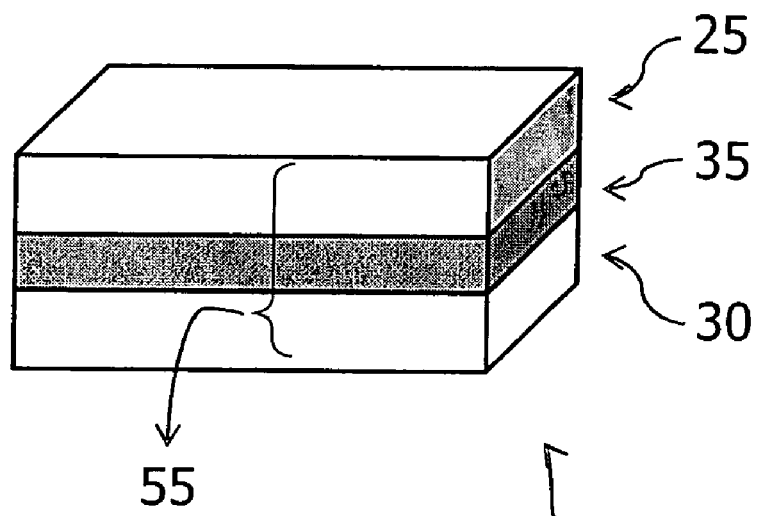
FIG. 2 shows a perspective view of a first ignition unit.

According to the present invention, ignition units 20 each have two planar metallic electrodes 25, 30 positioned parallel to each other, as shown in FIG. 2, there being a planar ceramic insulator 35 located in the space between electrodes 25, 30. Metallic electrodes 25, 30 may be made of erosion-resistant materials such as tungsten, tungsten/lanthanum or graphite. Ignition units 20 are electrically connected to an ignition distributor, not shown, which controls the ignition of the individual ignition units 20. When a current pulse of sufficiently high voltage is applied between the two electrodes 25, 30 a glow discharge occurs, whereby the actual arc discharge from target cathode 10 to anode 5 is triggered.

When regarded from the front face 55 of ignition unit 20, the planar shape of ignition unit 20 results in a surface in the form of a linearly elongated rectangle for ceramic insulator 35. The length of the rectangle is many times greater than its width. In practice the length is up to approximately 10 cm. If ignition unit 20 is ignited a number of times in a row, at each ignition the ignition spark occurs at various locations distributed along the linearly elongated surface. Thus the burning point on target cathode 10 is shifted somewhat at each ignition. In a simple way, homogeneous utilization of the entire surface of target cathode 10 is achieved, which ultimately results in uniform coating of a workpiece.

Another advantage is found when the necessary number of planar ignition units 20 is compared to the number of non-planar ignition units, such as for example the disk-shaped ignition units. If target cathode 10 has the same length 38 in both cases (see FIG. 4), then fewer planar ignition units 20 are necessary, because each individual planar ignition unit 20 erodes a larger area homogeneously on target cathode 10. A smaller number of ignition units 20 reduces the maintenance expense and prolongs the service life.

Furthermore, because of their shape the planar ignition units 20 may be placed very close to target cathode 10; a smaller distance 22 from ignition unit 20 to target cathode 10 may be chosen than the distance from a non-planar ignition unit to target cathode 10. That increases the reliability of ignition significantly, and the coating process proceeds more reliably overall.

Figure 3:
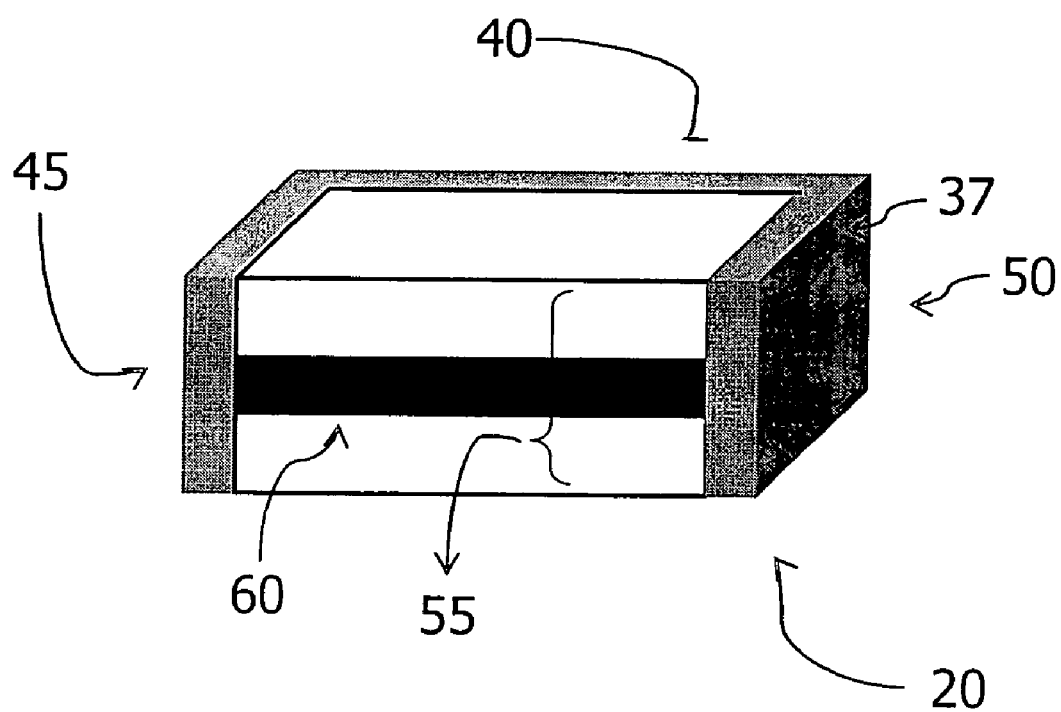
FIG. 3 shows a perspective view of a second ignition unit.

A second specific embodiment of ignition unit 20 is shown in FIG. 3, where the ceramic insulator is advantageously designed in two pieces. The first part is formed by a planar ceramic insulator 35, as known from the first specific embodiment. The second part of the ceramic insulator is a ceramic casing 37, which covers both the rear 40 and the lateral surfaces 45, 50 of ignition unit 20. That ensures that an ignition spark develops between the two planar electrodes 25, 30 only on the front face 55, which is not covered by ceramic casing 37. To better support the ignition process, ignition unit 20 also has its front face 55, at which the ignition occurs, inclined toward cathode 10 at a certain angle 58 of between 45° and 90° (see also FIG. 1).

Furthermore, in this preferred embodiment, the ceramic insulator 35 of ignition unit 20 is coated on its front face 55 with an electrically conductive material 60. When a pulse of current is applied to ignition unit 20, this results in a current path directed toward target cathode 10, since some of the conductive material 60 of ceramic insulator 35 vaporizes and a highly ionized plasma is accelerated onto target cathode 10. This current path formed of plasma in turn enables an additional current path for the actual main discharge from target cathode 10 to anode 5. The partial consumption of conductive material 60 on ceramic insulator 35 is compensated for by a recoating during the main discharge, so that the conductive coating is regenerated. This process ensures the continuing stability of ignition unit 20, even when operated over an extended time.

For reliable ignition, the polarity of ignition electrodes 25, 30 should be designed so that a maximum potential difference is produced between ignition unit 20 and target cathode 10. To this end a positive voltage is applied to the metallic electrode 30 which is located closer to target cathode 10, and a negative voltage to the metallic electrode 25 which is located further distant from target cathode 10.

Figure 4:
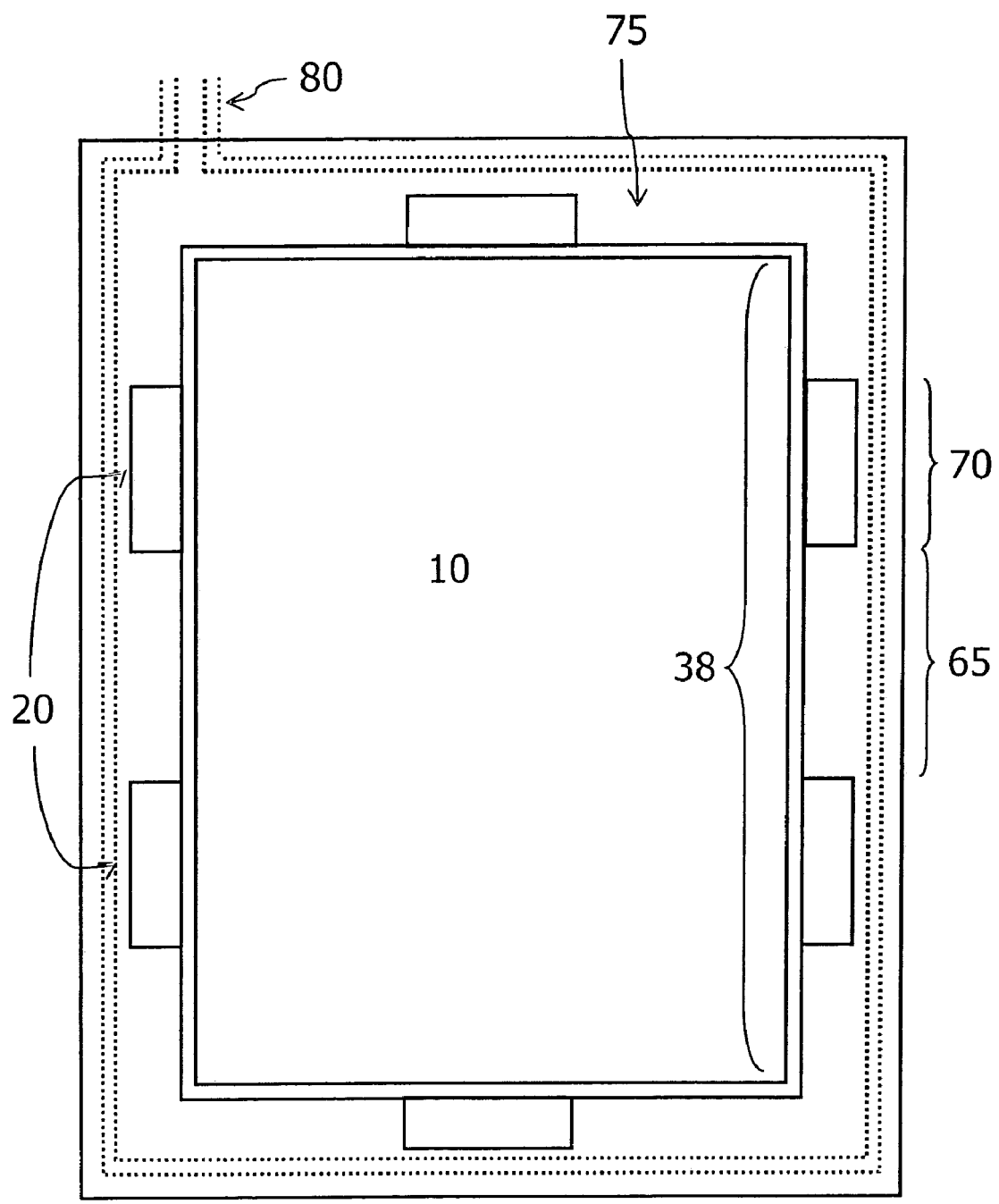
FIG. 4 shows a top view of a target cathode having a cooling water circuit, a base electrode, and a plurality of ignition units.

Also important for homogeneous erosion of the target material and homogeneous coating of a workpiece is the positioning of planar ignition units 20 according to the present invention with respect to target cathode 10. FIG. 4 shows a top view of a target cathode 10, with a plurality of ignition units 20 at the edge of target cathode 10. To ignite the main discharge at locations uniformly distributed on the target surface, a plurality of ignition units 20 is situated along the edge zone of the target in such a way that the overall effect of the individual ignition units 20 results in optimal, i.e., homogeneous erosion over the entire area of target cathode 10. This approach is made possible both by a variable distance 65 between ignition units 20 and by the option of being able to utilize suitable ignition units 20 having varying lengths 70. Unwanted side effects known in the past, such as the decreasing thickness of the coating at the upper and lower areas of the target surface, may be compensated for by a shorter distance 65 between ignition units 20 in the corresponding areas.

Another advantage of planar ignition units 20 in the system described above comes from the possibility of introducing a common, continuous base electrode 75 in a simple manner, which for example joins together all of the negatively polarized electrodes 25 of the individual ignition units 20 and thus places them in electrical contact.

Such a common, continuous base electrode 75 also offers the possibility of integrating a cooling water circuit 80 into base electrode 75. As may be seen from FIGS. 1 and 4, base electrode 75 has an integrated cooling water circuit 80, which is implemented by an internal cooling water line. That provides a simple way for cooling all of the ignition units 20. Cooling of ignition units 20 is necessary for stable long-term operation, since ignition units 20 are subject to a high heat load, in particular in the case of high ignition frequencies.

What is claimed is:
1. A device for carbon deposition using a pulsed, plasma-supported vacuum arc discharge, comprising:
   an anode;
   a target cathode made of carbon;
   a pulsed energy source;
   at least two ignition units situated in an edge area of the target cathode, the at least two ignition units each including two planar metallic electrodes situated parallel to each other, and a planar ceramic insulator situated in a space between the electrodes; and
   a continuous base electrode electrically connecting each of the at least two ignition units to each other and including a cooling water circuit configured to cool the at least two ignition units.

2. The device according to claim 1, wherein at least one of the ignition units is covered on a back side and on two lateral surfaces with a ceramic casing.

3. The device according to claim 1, wherein at least one of the ignition units has a front face, on which an ignition occurs, inclined toward the target cathode at an angle of between 45° and 90°.

4. The device according to claim 1, wherein the ceramic insulator has a front face coated with an electrically conductive material.

5. The device according to claim 1, wherein for homogeneous deposition over an entire area of the target cathode, at least one of a distance between the at least two ignition units and a length of the ignition units is variable.

6. The device according to claim 1, wherein a positive voltage is applied to the metallic electrode which is situated closer to the target cathode, and a negative voltage is applied to the metallic electrode which is situated farther away from the target cathode.

* * * * *